(12) United States Patent
Ohta et al.

(10) Patent No.: US 7,005,682 B2
(45) Date of Patent: Feb. 28, 2006

(54) SEMICONDUCTOR LIGHT EMITTING ELEMENT

(75) Inventors: Kiyohisa Ohta, Nara (JP); Hiroshi Nakatsu, Mihara (JP); Kazuaki Sasaki, Osaka (JP); Junichi Nakamura, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/766,606

(22) Filed: Jan. 27, 2004

(65) Prior Publication Data

US 2004/0188701 A1 Sep. 30, 2004

(30) Foreign Application Priority Data

Feb. 12, 2003 (JP) ............................. 2003-034306

(51) Int. Cl.
*H01L 33/00* (2006.01)

(52) U.S. Cl. .................... 257/97; 257/95; 257/102; 257/103

(58) Field of Classification Search ............ 257/94–97, 257/102, 103
See application file for complete search history.

(56) References Cited

U.S. PATENT DOCUMENTS 6,236,065 B1    5/2001   Kurahashi et al. ............ 257/93
6,621,106 B1 *  9/2003   Murakami et al. ............ 257/97

FOREIGN PATENT DOCUMENTS

JP      58-066370       4/1983
JP      58-223380       12/1983

\* cited by examiner

*Primary Examiner*—Gene M. Munson
(74) *Attorney, Agent, or Firm*—Morrison & Foerster LLP

(57) ABSTRACT

A semiconductor light emitting element of a monolithic structure, including: a first-conductivity-type semiconductor substrate; an active layer formed on the first-conductivity-type semiconductor substrate; a second-conductivity-type clad layer formed on the active layer; and a current diffusion layer formed on the second-conductivity-type clad layer, wherein the active layer is of a first conductivity type.

11 Claims, 5 Drawing Sheets

SEMICONDUCTOR LIGHT EMITTING ELEMENT

CROSS-REFERENCE TO RELATED APPLICATION

This application is related to Japanese application No. 2003-34306 filed on Feb. 12, 2003, whose priority is claimed under 35 USC § 119, the disclosure of which is incorporated by reference in its entirety.

BACKGROUND OF THE INVENTION

1. Field of the Invention

The present invention relates to a semiconductor light emitting element and, more particularly, to a semiconductor light emitting element of a monolithic structure.

2. Description of Related Art

Japanese Unexamined Patent Publication No. SHO 58(1983)-223380 discloses a semiconductor light emitting element of a monolithic structure (hereafter, also referred to as "monolithic array") comprising, as illustrated in FIG. 5E, an n-type GaAs buffer layer (not illustrated), an n-type AlInP clad layer 31, a non-doped active layer 32, a p-type AlInP clad layer 33, an AlGaAs current diffusion layer 34, a dielectric film (not illustrated) and a p-type electrode (not illustrated) formed in this order on an upper surface of an-type GaAs substrate 30, with an n-type electrode (not illustrated) provided on a lower surface of the n-type GaAs substrate 30.

With the above constitution, light emission should occur at the interfaces between the non-doped active layer 32 and portions of the p-type clad layer 33, but actually it occurs in the middle of the active layer 32 in its thickness direction (see: dotted line in FIGS. 5B–5E), for the reason below. In manufacturing the semiconductor light emitting element, the n-type GaAs buffer layer (not illustrated), the n-type AlInP clad layer 31, the non-doped active layer 32, the p-type AlInP clad layer 33 and the AlGaAs current diffusion layer 34 are formed in this order on the n-type GaAs substrate 30. Then, the resulting wafer is divided into segments by etching the p-type AlInP clad layer 33 and the AlGaAs current diffusion layer 34 so that light-emitting regions A are formed. At this time, unintended light-emitting regions B are also formed. Here, the light-emitting region A is a region where a portion of the p-type AlInP clad layer 33 is left after the etching and where the portion of the p-type AlInP clad layer 33 and the non-doped active layer 32 form an interface therebetween. The unintended light-emitting region B is a region where there is left no portion of the p-type AlInP clad layer 33, as illustrated in FIG. 5D.

P-type carriers diffuse from the p-type clad layer 33 into the active layer 32 when the p-type clad layer 33 is formed on the active layer 32, as illustrated in FIG. 5B, to form a p-type region in the active layer 32 on a p-type clad layer 33 side that extends to the middle of the active layer 32 in its thickness direction mentioned above. As a result, light emission occurs not at the interfaces between the non-doped active layer 32 and the portions of the p-type clad layer 33 but at the middle of the active layer (see: 35 in FIG. 5E). Therefore, electric current also flows through other portions of the active layer than the portions thereof which are included in the light-emitting regions A. Consequently, the area of the monolithic array through which electric current flows becomes significantly larger than designed.

This is the reason why further etching has conventionally been carried out to remove, as illustrated in FIG. 5E, surface areas of the unintended light-emitting regions B, and thereby to cause light emission only in the light-emitting regions A (see: 35 in FIG. 5E).

Such etching, however, finds difficulties in controlling the amount of etching.

SUMMARY OF THE INVENTION

The present invention has been made in view of the above circumstances and an object thereof is to provide a highly reliable and inexpensive semiconductor light emitting element wherein an original conductivity type of an active layer is maintained so as not to be changed to the same conductivity type as that of a layer overlying the active layer, whereby pn junctions are formed only at the interfaces between the active layer and portions of the overlying layer.

The present invention provides a semiconductor light emitting element of a monolithic structure, comprising: a first-conductivity-type semiconductor substrate; an active layer formed on the first-conductivity-type semiconductor substrate; a second-conductivity-type clad layer formed on the active layer; and a current diffusion layer formed on the second-conductivity-type clad layer, wherein the active layer is of a first conductivity type.

According to the present invention, even when second-conductivity-type impurities diffuse from the second-conductivity-type clad layer into the first-conductivity-type active layer, the first conductivity type of the active layer can be maintained so as not to be changed to a second conductivity type, and light emission is caused only in predetermined regions. Therefore, division of the wafer into segments can be ensured without carrying out etching required for inhibiting electric current from flowing through other portions of the active layer than the portions thereof which are included in the light-emitting regions A.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

A semiconductor light emitting element of the present invention has a monolithic structure where, on a first-conductivity-type semiconductor substrate, there are formed at least an active layer, a second-conductivity-type clad layer and a current diffusion layer in this order. Ordinarily, the present semiconductor light emitting element is provided with electrodes on both its upper and lower surfaces, i.e., on both an upper surface of the current diffusion layer and an lower surface of the semiconductor substrate. The electrodes are normally a single-layer film of a metal such as titanium, aluminum or gold alone or a laminated film of two or more of these films or an alloy of two or more of these metals. Also, these electrodes may have any shape depending on the size and arrangement of the light-emitting regions.

According to the present invention, a first conductivity type refers to a p- or n-type, and a second conductivity type refers to a reverse conductivity type of the first conductivity type, i.e., the n- or p-type.

The semiconductor substrate is not particularly limited to a GaAs substrate. The concentration of first-conductivity-type impurities in the semiconductor substrate is suitably, for example, in the range of about $1 \times 10^{19}$ to $5 \times 10^{19}$ cm$^{-3}$.

Figure 4:
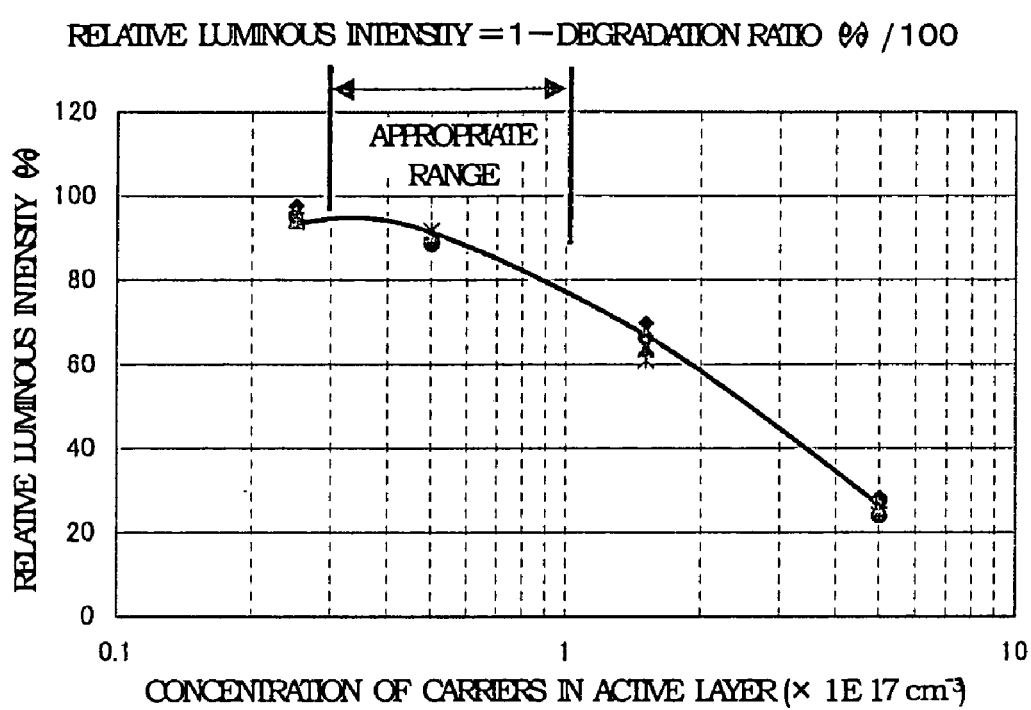
FIG. 4 is a graph where relative luminous intensity is plotted against concentration of impurities in an active layer of a semiconductor light emitting element of the present invention.
Figure 5A:
FIGS. 5A to 5E are schematic cross sections for illustrating steps in manufacturing a conventional semiconductor light emitting element.
Figure 5B:
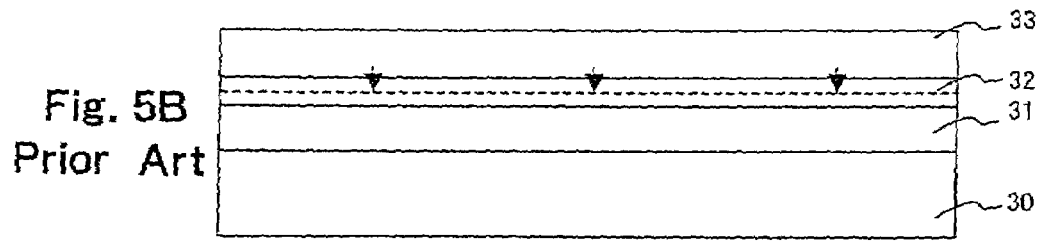
Figure 5C:
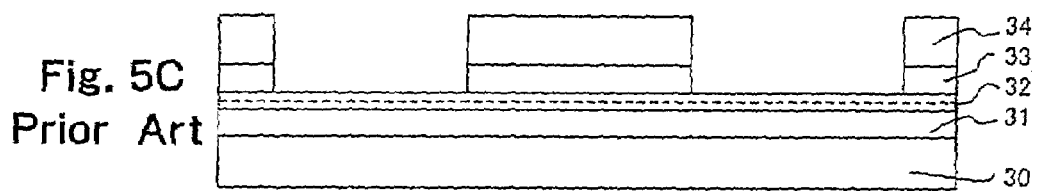
Figure 5D:
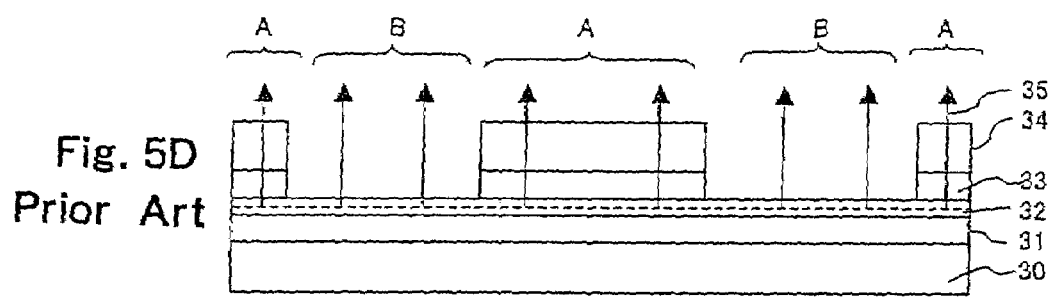
Figure 5E:
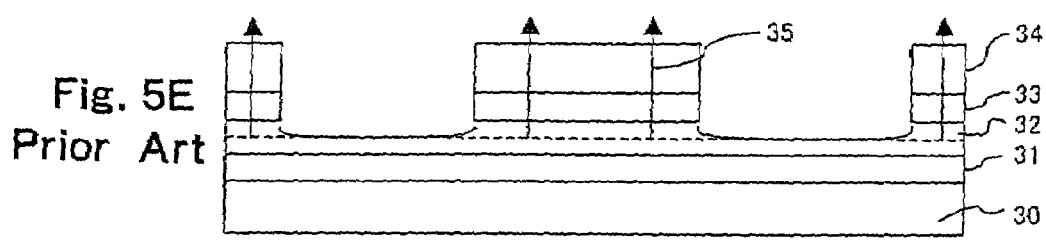

The active layer is substantially of the first conductive type. For this reason, the active layer contains first-conductivity-type impurities. Regarding the first-conductivity-type impurities in the active layer, examples of n-type impurities include Si, Se and the like, and examples of p-type impurities include Zn, Mg and the like. The concentration of the impurities in the active layer greatly affects the luminous intensity of the semiconductor light emitting element. For example, as illustrated in FIG. 4, when the concentration of the impurities in the active layer is higher than about $1 \times 10^{17}$ cm$^{-3}$ upon the lapse of 25 hours after the starting of passage of electric current, the relative luminous intensity expressed by (1-degradation ratio (%))/100 is about 70% or lower, with large variations caused in the current properties of the semiconductor light emitting element. When the impurity concentration is $3 \times 10^{16}$ cm$^{-3}$ or lower, on the other hand, the first conductivity type of the active layer is difficult to maintain because second-conductivity-type impurities diffusing from the overlying layer into the active layer cancel a large number of first-conductivity-type impurities in the active layer to decrease the concentration of the first-conductivity-type impurities in the active layer.

For the above reason, in order to ensure that the first conductivity type of the active layer will be maintained, the impurity concentration is preferably in the range of about $3 \times 10^{16}$ to $30 \times 10^{16}$ cm$^{-3}$ and, more preferably, about $3 \times 10^{16}$ to $10 \times 10^{16}$ cm$^{-3}$.

The active layer is suitably a semiconductor layer containing, for example, Al, Ga, As, In and/or P as constituent atoms. More specifically, it is preferable that the active layer be formed of $(Ga_{1-x}Al_x)_zIn_{1-z}P$ (wherein, for example, x=0.3, z=0.5, though x and z may be such that $0.1 \leq x \leq 0.9$, and $0.2 \leq z \leq 0.8$). The thickness of the active layer is suitably, for example, about 0.4 to 0.8 µm. The Al mixed crystal ratio of the active layer is preferably, for example, about 0.2 to 0.5 and, more preferably, about 0.3, taking into the consideration of the Al mixed crystal ratio of the second-conductivity-type clad layer to be described below.

The second-conductivity-type clad layer is suitably a semiconductor layer containing, for example, Al, Ga, As, In and/or P as constituent atoms. More specifically, it is preferable that the clad layer be formed of $(Ga_{1-y}Al_y)_mIn_{1-m}P$ (wherein, for example, y=0.7, m=0.5, though y and m may be such that $0.1 \leq y \leq 0.9$, and $0.2 \leq m \leq 0.8$) In the case where the active layer is formed of GaAlInP and the second-conductivity-type clad layer is also formed of GaAlInP, it is preferable that the Al mixed crystal ratio of the active layer be lower than that of the second-conductivity-type clad layer. More specifically, the Al mixed crystal ratio of the second-conductivity-type clad layer may be about 0.5 to 0.9 and, more preferably, about 0.7. The concentration of impurities in the second-conductivity-type clad layer is suitably, for example, in the range of about $1 \times 10^{17}$ to $4 \times 10^{17}$ cm$^{-3}$. The thickness of the clad layer is suitably, for example, about 0.7 to 1.0 µm.

The current diffusion layer is a layer used for diffusing electric current effectively across pn junctions. The current diffusion layer is suitably, for example, a semiconductor layer containing Al, Ga, As, In and/or P as constituent atoms. More specifically, the current diffusion layer may be formed of GaAlAs, GaAlInP or the like and, more preferably, of $Ga_{1-n}Al_nAs$ (n=0.7). The concentration of impurities in the current diffusion layer is suitably in the range of, for example, about $0.5 \times 10^{18}$ to $2 \times 10^{18}$ cm$^{-3}$. The thickness of the current diffusion layer is suitably, for example, about 2 to 4 µm.

According to the present invention, a spacer layer is preferably provided between the active layer and the second-conductivity-type clad layer. The spacer layer serves to reduce the number of the impurities diffusing from the second-conductivity-type clad layer into the active layer, thereby effectively assisting in maintaining the first conductivity type of the active layer. The spacer layer is preferably formed of a semiconductor layer. More specifically, the spacer layer may be formed of, for example, the same material as that of the active layer, that of the second-conductivity-type clad layer or that of the current diffusion layer. Especially, the spacer layer is preferably formed of the same constituent atoms in the same composition as is the case of the second-conductivity-type clad layer. The spacer layer is formed substantially as a non-doped layer. The thickness of the spacer layer is suitably, for example, about 0.1 to 0.2 µm.

According to the present invention, a buffer layer, a clad layer and/or a dielectric layer may be formed between the first-conductivity-type semiconductor substrate and the active layer, between the second-conductivity-type clad layer and the current diffusion layer, and/or above the current diffusion layer. The buffer layer, the clad layer and/or the dielectric layer may be either a non-doped layer or a first or second-conductivity-type layer. Each of these layers may be formed of a known material, as a layer with a known thickness and shape in the art.

The present invention will now be explained in detail based on the preferred embodiment illustrated in the drawings. It should be understood that the present invention is not limited to the embodiment.

Embodiment 1

Figure 1A:
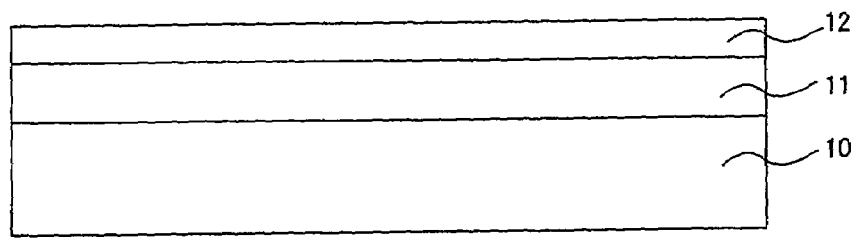
FIGS. 1A to 1D are schematic cross sections for illustrating steps in manufacturing a semiconductor light emitting element according to an embodiment of the present invention.

As illustrated in FIG. 1A, on an n-type GaAs substrate 10, there were formed an n-type GaAs buffer layer (not illustrated), an n-type $Al_{0.5}In_{0.5}P$ clad layer 11, an n-type $(Ga_{0.7}Al_{0.3})_{0.5}In_{0.5}P$ active layer 12 in this order by MOCVD (metal organic chemical vapor deposition). At this time, the active layer 12 was doped with Si as impurities to a concentration of $8 \times 10^{16}$ cm$^{-3}$. The thicknesses of the n-type GaAs buffer, the n-type $Al_{0.5}In_{0.5}P$ clad layer 11 and the n-type $(Ga_{0.7}Al_{0.3})_{0.5}In_{0.5}P$ active layer 12 were 0.1 µm, 0.75 µm and 0.6 µm, respectively.

Figure 1B:
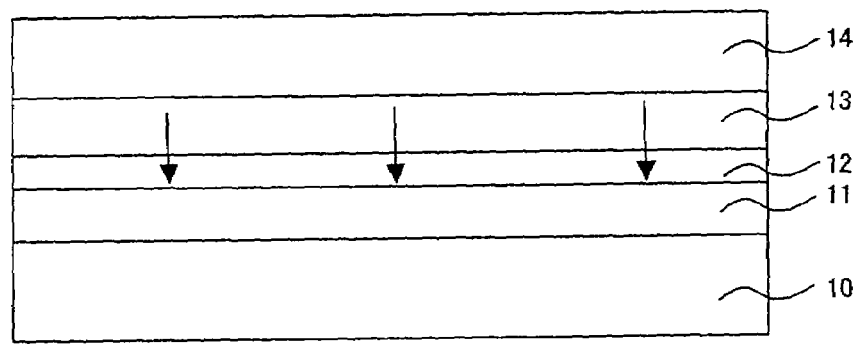

Subsequently, as illustrated in FIG. 1B, a p-type $(Ga_{0.3}Al_{0.7})_{0.5}In_{0.5}P$ clad layer 13 and a p-type GaAlAs current diffusion layer 14 were formed in this order on the active layer 12 by MOCVD, thereby completing a wafer. The thicknesses of the p-type $(Ga_{0.3}Al_{0.7})_{0.5}In_{0.5}P$ clad layer 13 and the p-type GaAlAs current diffusion layer 14 were 0.85 μm and 3.0 μm, respectively. The p-type clad layer 13 and the p-type current diffusion layer 14 were each doped with Zn as a dopant to a concentration of $2.5 \times 10^{17}$ cm$^{-3}$. Though the p-type impurities diffused into the active layer 12 when the p-type clad layer 13 was formed thereon, the active layer 12 did not turn into a p-type layer and remained a n-type layer because the active layer was doped advance with the n-type impurities.

Then, an Au alloy film was formed by sputtering on an entire surface of the wafer (i.e., on an entire upper surface of the current diffusion layer 14). Using as a mask a resist pattern formed on the Au alloy film by a photolithography technique, the Au alloy film was patterned by etching to form electrodes of a predetermined shape (not illustrated).

Figure 1C:
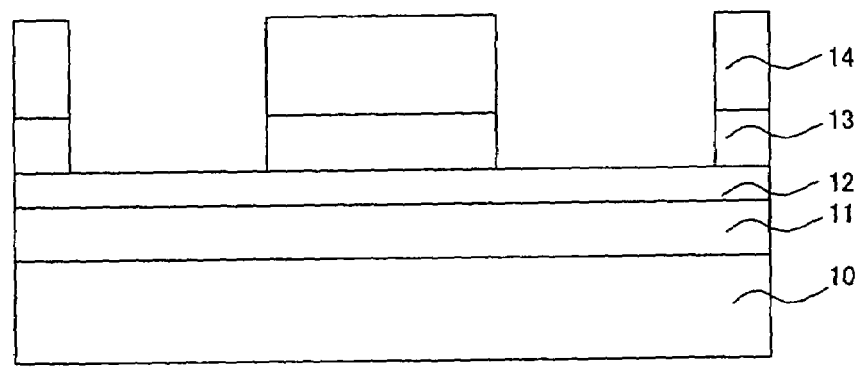

Further, to the surface of the wafer including these electrodes, a resist was applied and the photolithography technique was used to form a resist pattern on the electrodes. Thereafter, using this resist pattern as a mask, the p-type current diffusion layer 14 and the p-type clad layer 13 were patterned by etching, as illustrated in FIG. 1C, using phosphoric acid and an etchant containing sulfuric acid. The etching stopped at a surface of the active layer 12 because the Al mixed crystal ratio of the active layer 12 is lower than that of the clad layer 13.

Figure 1D:
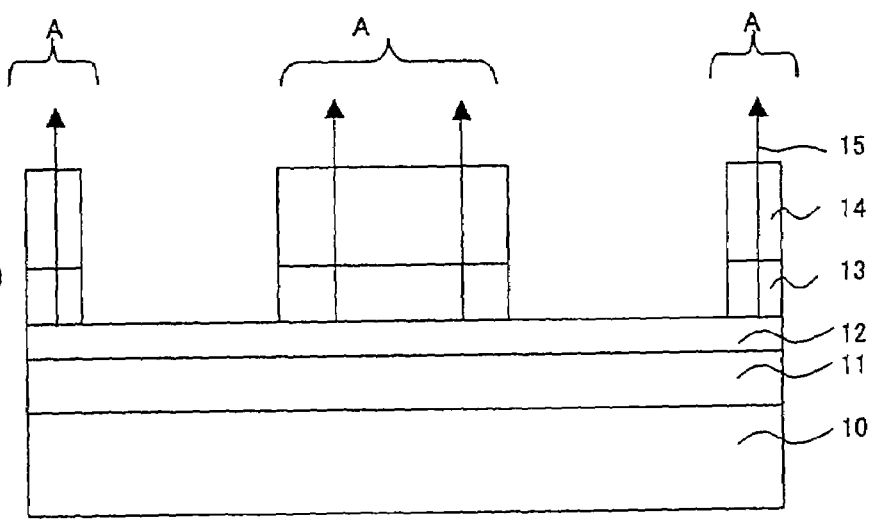
Figure 2A:
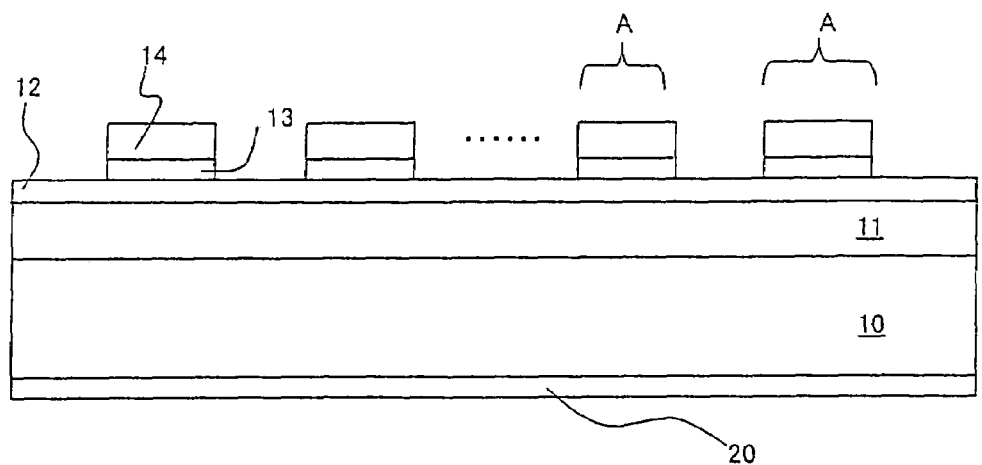
FIGS. 2A and 2B are a schematic cross section and a plan view of the semiconductor light emitting element according to the embodiment.
Figure 2B:
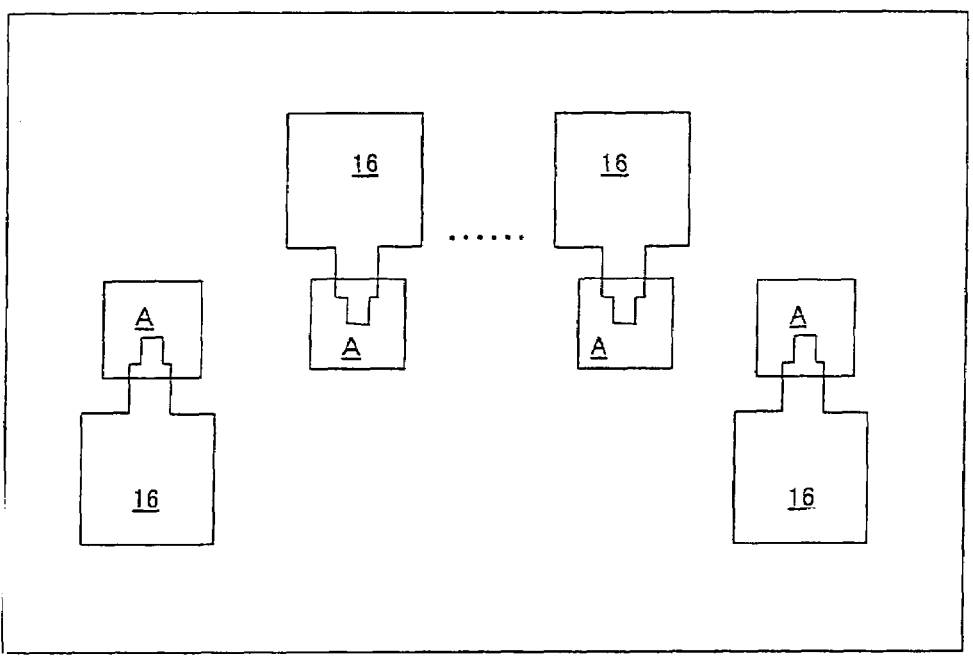
Figure 3A:
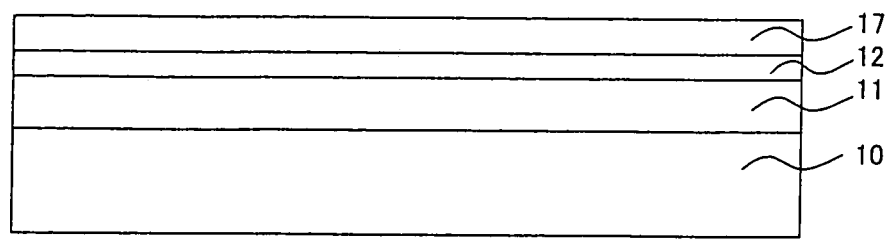
FIGS. 3A to 3D are schematic cross sections for illustrating steps in manufacturing a semiconductor light emitting element according to another embodiment of the present invention.
Figure 3B:
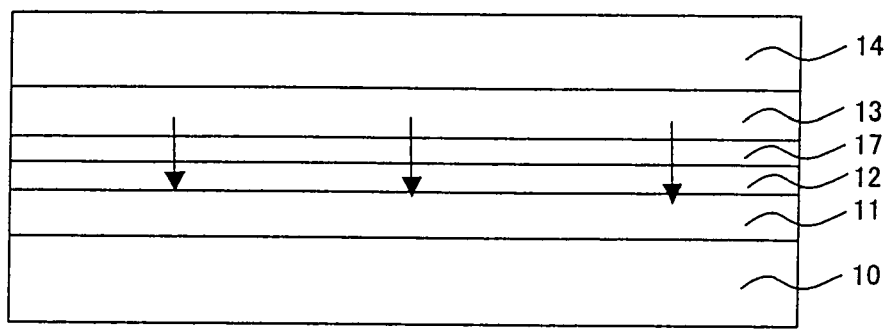
Figure 3C:
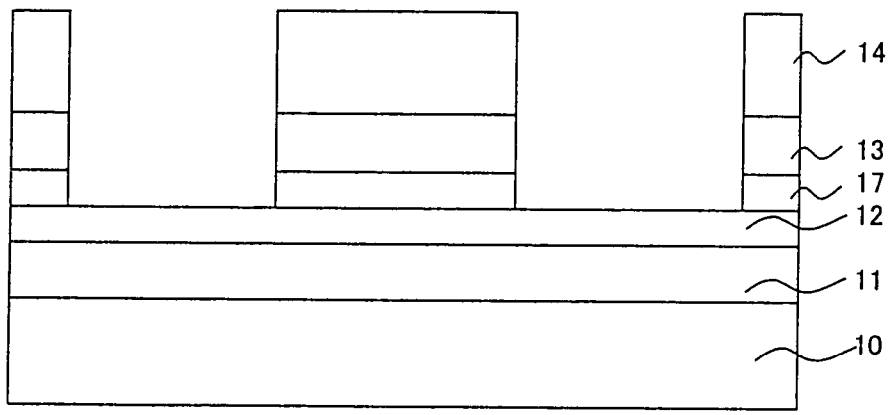
Figure 3D:
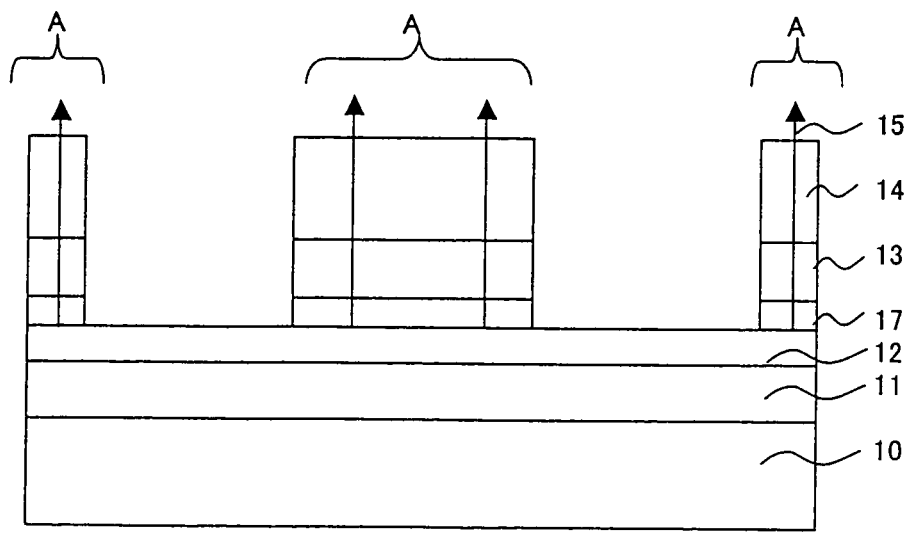

Thus, at the interfaces between portions of the clad layer 13 and the underlying active layer 12, a plurality of pn junctions were formed per unit area to be a chip of the wafer. The pn junctions were located in a portion of each unit area, as illustrated in FIGS. 1D, 2A and 2B. Light emission occurred at these pn junctions. The resulting wafer had a monolithic array structure. Further, electrodes 16 were connected to portions of the p-type current diffusion layer 14, respectively, which were included in the light-emitting regions A, as illustrated in FIG. 2B. Electrodes 20 were formed on a lower surface of the n-type GaAs substrate 10, as illustrated in FIG. 2A. According to a semiconductor light emitting element of this structure of Embodiment 1, light emission occurred only in the light-emitting regions A at the interfaces between portions of the clad layer 13 and the underlying active layer 12. Therefore, no unintended light emission was caused (see: 15 in FIG. 1D). Thus, there was no need to carry out further etching of the active layer 12. Consequently, manufacture of the semiconductor light emitting element was facilitated.

Then, the wafer was sectioned by dicing into a plurality of chips.

When electric current was passed through the semiconductor light emitting element, no unintended light emission was caused and a favorable light emission state was produced. This is because no pn junctions were formed in the middle of the active layer 12 in its thickness direction. Also, division of the wafer into segments was ensured without carrying out etching required for inhibiting electric current from flowing through other portions of the active layer than the portions thereof which are included in the light-emitting regions A.

According to the present embodiment, the p- and n-type of all the layers may be reversed. In such a case, Zn or Mg may be used as impurities instead of Si.

Embodiment 2

A semiconductor light emitting element of the present embodiment was substantially the same as that of Embodiment 1, except that a spacer layer 17 was provided between the active layer 12 and the clad layer 13, as illustrated in FIGS. 3A to 3D.

The spacer layer 17 was formed of $(Ga_{0.3}Al_{0.7})_{0.5}In_{0.5}P$ substantially as a non-doped layer with a thickness of 0.1 to 0.2 μm, as is the case of the p-type clad layer 13.

According to the semiconductor light emitting element of Embodiment 2, the spacer layer 17 served to reduce the number of the p-type impurities diffusing from the p-type clad layer 13, thereby further effectively assisting in maintaining the n-type of the active layer 12.

According to the semiconductor light emitting element of a monolithic structure of the present invention, even when the second-conductivity-type impurities in the overlying layer diffuse into the active layer after the formation of the active layer, the first-conductivity-type of the active layer can be maintained, so that unintended light emission can be inhibited. Also, in manufacturing the semiconductor light emitting element of the present invention, there is no need to carry out further etching of the active layer for the purpose of inhibiting unintended light emission. Accordingly, the semiconductor light emitting element of the present invention can be obtained by a simplified process at a low cost with a good yield, while its good performance characteristics are ensured.

According to the present invention, if the semiconductor substrate is a GaAs substrate and if the active layer is a semiconductor layer containing both Al, Ga, As, In and/or P as constituent atoms and Si or Se as first-conductivity-type impurities, the first-conductivity-type impurities (for example, Si) and the constituent atoms of the active layer (for example, Zn) do not produce a compound in the active layer, so that electrical division of the wafer into light-emitting regions can be ensured.

When the concentration of the first-conductivity-type impurities in the active layer is optimised to be in the range of $3 \times 10^{16}$ to $10 \times 10^{16}$ cm$^{-3}$, the first-conductivity-type of the active layer is surely maintained so as to improve the reliability of the semiconductor light emitting element.

Further, according to the present invention, when the spacer layer is provided between the active layer and the second-conductivity-type clad layer, the spacer layer serves to further reduce the number of the second-conductivity-type impurities diffusing from the second-conductivity-type clad layer into the active layer. Also, since the second-conductivity-type impurities diffuse from the second-conductivity-type clad layer into the spacer layer to cause it to turn into substantially a second-conductivity-type layer, there are formed pn-junctions at the interfaces between the spacer layer and the active layer.

Also, when the spacer layer is formed of the same constituent atoms in the same composition as is the case of the second-conductivity-type clad layer, the spacer layer can be etched simultaneously with the etching of the second-conductivity-type clad layer which is carried out for forming the light emitting regions. Therefore, the manufacturing process of the semiconductor light emitting element can be simplified, whereby the semiconductor light emitting element of the present invention can be obtained at a low cost.

Further, when the Al mixed ratio of the active layer is lower than that of the second-conductivity-type clad layer, etching of the second-conductivity-type clad layer and, optionally, the spacer layer can be carried out with improved accuracy because it stops at the surface of the active layer. Therefore, the semiconductor light emitting element of the present invention can be obtained in a low cost by a simplified manufacturing process.

What is claimed is:

1. A semiconductor light emitting element of a monolithic structure, comprising:

a first-conductivity-type semiconductor substrate;

a first-conductivity-type clad layer formed on the first-conductivity-type semiconductor substrate;

an active layer formed on the first-conductivity-type clad layer;

a second-conductivity-type clad layer formed on the active layer; and a current diffusion layer formed on the second-conductivity-type clad layer, wherein the active layer is of a first conductivity type.

2. The element of claim 1, wherein the semiconductor substrate is a GaAs substrate, and the active layer is a semiconductor layer containing Al, Ga, As, In and/or P as constituent atoms.

3. The element of claim 1, wherein the active layer contains Si or Se atoms as first-conductivity-type impurities.

4. The element of claim 1, wherein the active layer contains Zn or Mg as first-conductivity-type impurities.

5. The element of claim 1, wherein the active layer contains first-conductivity-type impurities in a concentration between $3 \times 10^{16}$ and $10 \times 10^{16}$ cm$^{-3}$.

6. A semiconductor light emitting element of a monolithic structure, comprising:

a first-conductivity-type semiconductor substrate;

a first-conductivity-type clad layer formed on the first-conductivity-type semiconductor substrate;

an active layer formed on the first-conductivity-type clad layer;

a spacer layer formed on the active layer;

a second-conductivity-type clad layer formed on the spacer layer; and a current diffusion layer formed on the second-conductivity-type clad layer, wherein the active layer is of a first conductivity type.

7. The element of claim 6 wherein the spacer layer is either a non-doped layer or a second-conductivity-type layer.

8. The element of claim 6, wherein the spacer layer has a thickness of 0.1 to 0.2 $\mu$m.

9. The element of claim 6, wherein the spacer layer is formed of the same constituent atoms in the same composition as is the case of the second-conductivity-type clad layer.

10. The element of claim 1 or 9, wherein the active layer is formed of GaAlInP, the second-conductivity-type clad layer is also formed of GaAlInP, and the Al mixed crystal ratio of the active layer is lower than that of the second-conductivity-type clad layer.

11. The element of claim 10, wherein the Al mixed crystal ratios of the second-conductivity-type clad layer and the spacer layer are approximately 0.7, and that of the active layer is approximately 0.3.

* * * * *